United States Patent [19]

Kanai et al.

[11] Patent Number: 4,772,570
[45] Date of Patent: Sep. 20, 1988

[54] METHOD FOR PRODUCING AN ELECTRONIC DEVICE HAVING A MULTI-LAYER STRUCTURE

[75] Inventors: Masahiro Kanai, Tokyo; Masaaki Hirooka, Toride; Jun-Ichi Hanna; Isamu Shimizu, both of Yokohama, all of Japan

[73] Assignee: Canon Kabushiki Kaisha, Tokyo, Japan

[21] Appl. No.: 946,206

[22] Filed: Dec. 24, 1986

[30] Foreign Application Priority Data

Dec. 28, 1985 [JP] Japan .................... 60-297835

[51] Int. Cl.⁴ .......................................... H01L 21/20
[52] U.S. Cl. ........................ 437/109; 437/4; 437/101; 427/39; 427/74; 136/258
[58] Field of Search ............... 148/174; 136/258 AM; 427/39, 74, 86; 437/2, 4, 101, 108, 109

[56] References Cited

U.S. PATENT DOCUMENTS

| | | | |
|---|---|---|---|
| Re. 31,708 | 10/1984 | Gordon | 427/126.2 |
| 3,473,978 | 10/1969 | Jackson et al. | 437/93 |
| 3,888,705 | 6/1975 | Fletcher et al. | 437/107 |
| 4,146,657 | 3/1979 | Gordon | 427/126 |
| 4,239,811 | 12/1980 | Kemlage | 437/238 |
| 4,357,179 | 11/1982 | Adams et al. | 437/19 |
| 4,402,762 | 9/1983 | John et al. | 437/16 |
| 4,421,592 | 12/1983 | Shaskus et al. | 156/613 |
| 4,448,801 | 5/1984 | Fukuda et al. | 427/39 |
| 4,462,847 | 7/1984 | Thompson et al. | 427/2 |
| 4,504,518 | 3/1985 | Ovshinsky et al. | 427/38 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 X |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |

FOREIGN PATENT DOCUMENTS

| | | |
|---|---|---|
| 74212 | 3/1983 | European Pat. Off. . |
| 90586A | 10/1983 | European Pat. Off. . |
| 59-199035 | 12/1984 | Japan . |
| 60-43819 | 3/1985 | Japan ............ 136/258 AM |
| 2038086A | 7/1980 | United Kingdom . |
| 2148328A | 5/1985 | United Kingdom . |

OTHER PUBLICATIONS

Brodsky et al., *IBM Technical Disclosure Bulletin*, vol. 22, 3391, (Jan. 1980).
Inoue, *Appl. Phys. Lett.*, 43(8), 15 Oct. 83, p. 774.
Ohnishi et al., Proceedings, 6th E.C. Photovoltaic Solar Energy Conference, London, Apr. 15–19, 1985, pp. 677–681.
Sakai et al., Proceedings, 6th E.C. Photovoltaic Solar Energy Conference, London, Apr. 15–19, 1985, pp. 682–686.

*Primary Examiner*—Aaron Weisstuch
*Attorney, Agent, or Firm*—Fitzpatrick, Cella, Harper & Scinto

[57] ABSTRACT

A method for producing an electronic device having a multi-layer structure comprising one or more valence electron controlled semiconductor thin layers formed on a substrate comprises forming at least one of said valence electron controlled semiconductor thin layers controlled according to the plasma CVD method and forming at least one of the other constituent layers according to the method comprising introducing a gaseous starting material for formation of a deposited film and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film.

16 Claims, 4 Drawing Sheets

METHOD FOR PRODUCING AN ELECTRONIC DEVICE HAVING A MULTI-LAYER STRUCTURE

BACKGROUND OF THE INVENTION

1. Field of the Invention

This invention relates to an electronic device having a multi-layer structure such as a thin film semiconductor device, photovoltaic device, an image forming member for electrophotography, etc., and a method for producing the same.

2. Related Background art

In the prior art, functional films, i.e., semiconductor thin films for electronic devices such as thin film semiconductor devices, imaging devices, etc., particularly amorphous or polycrystalline semiconductor films, are formed individually by suitable film forming methods from the standpoint of desired physical characteristics, uses, etc.

For example, for formation of an amorphous or polycrystalline, i.e., non single crystalline, silicon film, which is optionally compensated for lone pair electrons with a compensating agent such as hydrogen atoms (H) or halogen atoms (X), etc., (hereinafter abbreviated as "NON Si (H,X)", particularly "A-Si (H,X)" when indicating amorphous silicon and "poly-Si (H,X)" when indicating polycrystalline silicon; the so-called microcrystalline silicon is included within the category of A-Si (H,X) as a matter of course), there have been employed the vacuum vapor deposition method, the plasma CVD (PCVD) method, the thermal CVD method, the reactive sputtering method, the ion plating method, the optical CVD method, etc. Generally, the plasma CVD method has been widely used and industrialized.

However, the reaction process during formation of a silicon film according to the plasma CVD method which has been generalized in the prior art is considerably complicated as compared with the CVD method of the prior art, and its reaction mechanism involves not a few unclear points. Also, there are a large number of parameters for formation of a deposited film (for example, substrate temperature, flow rates and flow rate ratio of introduced gases, pressure during formation, high frequency power, electrode structure, structure of reaction vessel, evacuation rate, plasma generating system, etc.). Because of the dependency on such a large number of parameters, the plasma which is formed may sometimes become unstable, which often leads to marked deleterious effects on the deposited film. Besides, such parameters are characteristic of each apparatus and must be selected individually. Therefore, under the present situation, it is difficult to standardize the production conditions.

On the other hand, for a silicon film to exhibit sufficiently satisfactory electrical or optical characteristics for particular uses, it is now accepted that the best way to form it is according to the plasma CVD method.

However, depending on the application use of a silicon film, bulk production with reproducibility may be required with satisfactory results in terms of enlargement of area, uniformity of film thickness as well as uniformity of film quality, and therefore in the formation of silicon films according to the plasma CVD method, an enormous investment in the installation is indispensable for a bulk production apparatus and control means for such bulk production is complicated, with tolerance limits of control being narrow and control of apparatus being severe. These are pointed out as problem to be improved in the future.

Also, in the case of the plasma CVD method, since plasma is directly generated by high frequencies, microwaves, etc., in a film forming space in which a substrate for film formation thereon is placed, electrons or a number of other ionic species generated therein may damage a film being formed in the film forming process thereby lowering the film quality or causing non-uniformity of film quality.

Particularly, in the case of producing an electronic device having a multi-layer structure, interface defects formed between the respective layers may cause worsening of the characteristics of the electronic device obtained. There is shown in FIG. 4 an image forming member for electrophotography as an example, which member comprises a substrate 400 made of aluminum, consisting of a charge injection preventing layer (first layer, amorphous silicon doped with boron B) 401, a photosensitive layer (second layer, amorphous silicon not doped with impurities such as B) 402 and a surface protective layer (third layer, amorphous silicon carbide) 403 respectively deposited on substrate 400. If all the layers are to be formed by the PCVD method, since the kinds of starting material gases, flow rates and plasma discharging intensity for formation of the respective deposited layers differ extremely from one another, effort is required to decrease the influence of the interfaces formed between the respective deposited layers, ordinarily by stopping the discharge between the steps for formation of the first layer and the second layer or for formation of the second layer and the third layer in order to completely exchange the gases, or if continuous production is to be employed, by providing a graded layer by varying gradually the kinds of gases, flow rates and plasma discharge intensity, or by providing separate deposition chambers for formation of the respective deposited layers separately. In any case, ions generated in the plasma bombard a deposited layer thereby to increase defects. Particularly, in producing an electronic device having a multi-layer constitution, the influence of ion bombardment in plasma is noticeably severe on the interfaces of respective layers. For this reason, satisfactory improvement therein is required.

As described above, in the formation of silicon films, problems to be solved still remain, and it has been desired to develop a method for forming a deposited film which is capable of bulk production with conservation of energy by the use of an apparatus of low cost, while maintaining the characteristics as well as uniformity of the films at a practically applicable level. Particularly, it has been desired to improve the interface characteristics of an electronic device having a multi-layer structure such as a thin film transistor, photovoltaic device, photosensitive member for electrophotography, etc.

SUMMARY OF THE INVENTION

An object of the present invention is to remove such drawbacks for forming a deposited film as described above and at the same time to provide a novel method for producing an electronic device without the use of the formation method of the prior art and an electronic device obtained thereby.

Another object of the present invention is to provide a method capable of obtaining a deposited film with improved interface characteristics over a large area with easy control of film quality and conservation of energy.

Still another object of the present invention is to provide a method for producing an electronic device having a multi-layer structure which is excellent in bulk productivity, having high quality as well as excellent physical characteristics such as electrical, optical, and semiconductor characteristics.

According to the present invention, there is provided a method for producing an electronic device having a multi-layer structure comprising one or more valence electron controlled semiconductor thin layers formed on a substrate, which comprises forming at least one of said valence electron controlled semiconductor thin layers according to the plasma CVD method and forming at least one of the other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film (hereinafter abbreviated as FOCVD), and an electronic device obtained thereby.

According to the method for producing an electronic device of the present invention, a film having a multi-layer constitution improved in interface characteristics is obtained and simplification of control and bulk production can be effected with satisfactory enlargement of area, uniformity of film thickness and film quality simultaneously with conservation of energy, without requiring an enormous investment for installation of bulk production apparatus, and also the control parameters for bulk production are clarified to afford broad tolerance limits and simple control of apparatus.

DESCRIPTION OF THE PREFERRED EMBODIMENT

Figure 1:
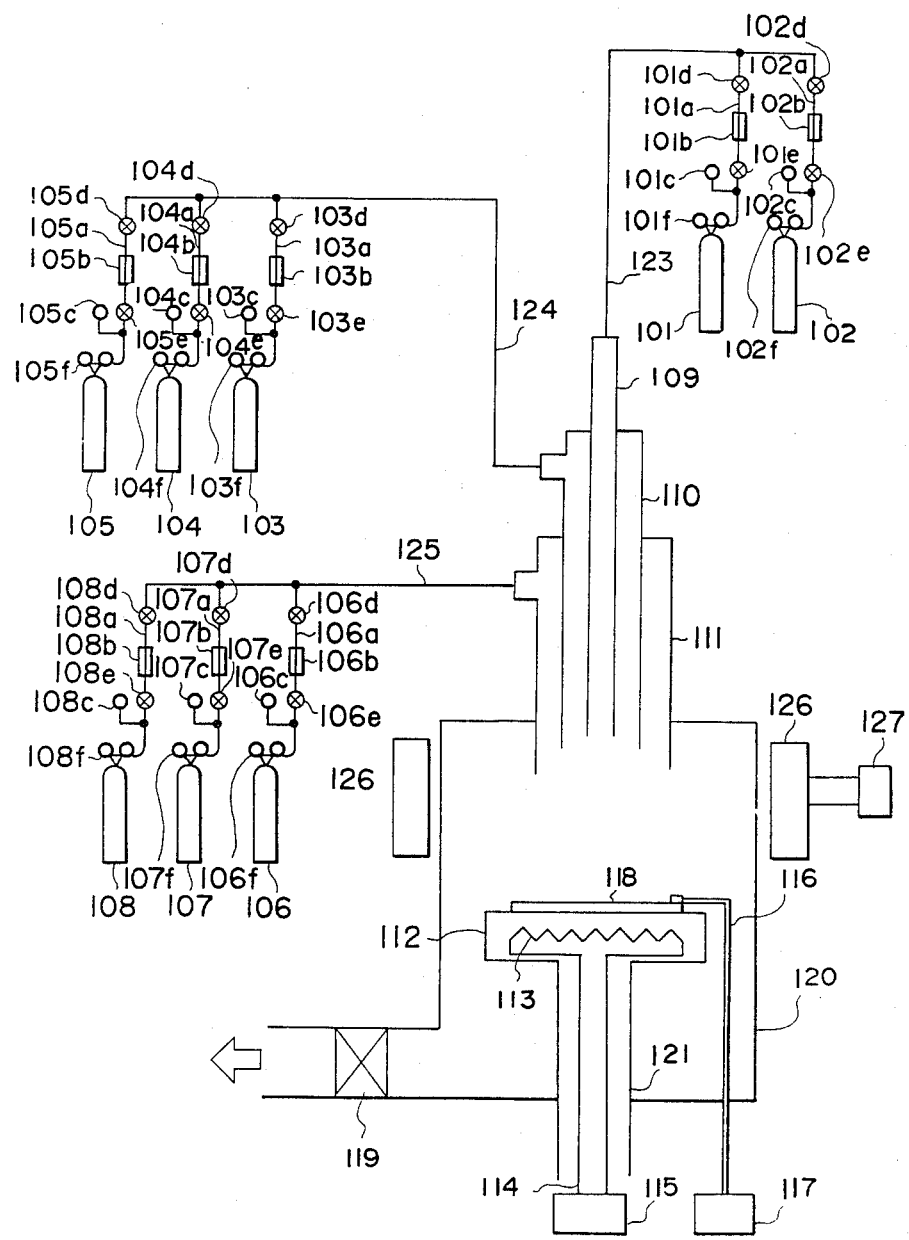
FIG. 1 is a schematic illustration of an apparatus for practicing the method of the present invention.

In the method for producing an electronic device of the present invention, the gaseous starting material to be used for formation of a deposited film (semiconductor thin film by the FOCVD method) is oxidized through chemical contact with a gaseous halogenic oxidizing agent and can be selected suitably as desired depending on the kind, characteristic, use, etc., of the deposited film to be obtained. In the present invention, the above gaseous starting material and the gaseous halogenic oxidizing agent need only to be gaseous during chemical contact when introduced into a reaction space and they can be either liquid or solid in their ordinary state.

When the starting material for formation of a deposited film or the halogenic oxidizing agent is liquid or solid, it is introduced into the reaction space in a gaseous state through bubbling with a carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for the deposited film and the gaseous halogenic oxidizing agent.

As the starting material for the deposited film to be used in the FOCVD method of the present invention, for example, if a tetrahedral type deposited film such as semiconductive or electrically insulating silicon or germanium, etc., is desired to be obtained, straight or branched chain silane compounds, cyclic silane compounds, chain-type germanium compounds, etc., may be employed. Specifically, examples of straight chain line silane compounds may include $Si_nH_{2n+2}$ (n=1, 2, 3, 4, 5, 6, 7, 8), examples of branched chain silane compounds include $SiH_3SiH(SiH_3)SiH_2SiH_3$, examples of cyclic silane compounds include $Si_nH_{2n}$ (n=3, 4, 5, 6) and examples of chain germanium compounds include $Ge_mH_{2m+2}$ (m=1, 2, 3, 4, 5), etc. If a deposited film of tin is desired to be prepared, hydrogenated tin such as $SnH_4$, etc., may be employed as an effective starting material.

Of course, these starting materials may be used either singly or as a mixture of two or more kinds, and may also be used as the starting material gas for forming films according to the plasma CVD method.

The halogenic oxidizing agent to be used in the present invention must be gaseous when introduced into the reaction space and at the same time must have the property of effectively oxidizing the gaseous starting material for film formation which is introduced into the reaction space by mere chemical contact therewith, and includes halogen gases such as $F_2$, $Cl_2$, $Br_2$, $I_2$. etc., and nascent fluorine, chlorine, bromine, etc.

The halogenic oxidizing agent is introduced into the reaction space in a gaseous state together with the starting material gas for film formation as described above at a desired flow rate and feed pressure, wherein it is mixed and reacted with the above starting material, thereby oxidizing the above starting material to efficiently generate a plurality of precursors including a precursor in a chemically excited state. Of the precursors in an excited state and other precursors which are generated, at least one of them functions as a feed source for the constituent element of the deposited film.

The precursors which are generated may undergo decomposition or reaction to be converted into other precursors in an excited state or to precursors in another excited state, or alternatively may be left in their original forms although, if desired, they may release energy on contact with the substrate surface arranged in the film forming space, whereby a deposited film with a three-dimensional network structure is prepared when the substrate surface temperature is relatively low or a crystalline deposited film is formed when the substrate surface temperature is higher.

In the present invention, so that the film forming process may proceed smoothly to form a film of high quality and having desired physical characteristics, the film forming factors, i.e., the kinds and combinations of the starting material and the halogenic oxidizing agent, their mixing ratio, pressure during mixing, flow rate, pressure in the film forming space, gas flow velocity and film forming temperature (substrate temperature and atmosphere temperature) are suitably selected as desired. These film forming factors are organically related to each other, and they are not determined individually but determined respectively under mutual relationships. In the present invention, the ratio of the gaseous starting material for film formation and the gaseous halogenic oxidizing agent introduced into the reaction space may be determined in relation to the film forming factors as mentioned above, but it is preferably 1/20 to 100/1, more preferably 1/5 to 50/1 in terms of flow rate ratio of introduced gases.

The pressure during mixing when the gases are introduced into the reaction space may be preferably higher in order to enhance the probability of chemical contact between the above gaseous starting material and the above gaseous halogenic oxidizing agent, but it is better to determine the optimum value as desired in view of reactivity. Although the pressure during mixing may be determined as described above, each pressure during introduction may be preferably $1 \times 10^{-7}$ atm to 5 atm, more preferably $1 \times 10^{-6}$ atm to 2 atm.

The pressure within the film forming space, namely the pressure of the space in which a substrate for film formation thereon is placed may be set suitably as desired so that precursors (E) in an excited state generated in the reaction space and sometimes precursors (D) formed as secondary products from said precursors (E) may contribute effectively to film formation.

The pressure inside the film forming space, when the film forming space is communicated openly to the reaction space, can be controlled in relation to the introduction pressures and flow rates of the gaseous starting material for film formation and the gaseous halogenic oxidizing agent into the reaction space, for example, by use of e.g., a differential evacuation or large scale evacuating device.

Alternatively, when the conductance at the communicating portion between the reaction space and the film forming space is small, the pressure in the film forming space can be controlled by providing an appropriate evacuating device to the film forming space and controlling the evacuation rate of said device.

On the other hand, when the reaction space and the film forming space are integral and the reaction position and the film forming position are only spatially different, it is possible to effect differential evacuation or provide a large scale evacuating device having sufficient evacuating capacity as described above.

As described above, the pressure in the film forming space may be determined according to the relationship between the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

The gas flow velocity is selected in view of the geometric arrangement of the gas introducing port, the substrate, and the gas discharging port such that the starting material for film formation and the halogenic oxidizing agent may be efficiently mixed during introduction of these into the reaction space, whereby the precursors (E) may be efficiently generated and film formation may be adequately performed without trouble. A preferable example of the geometric arrangement is shown in FIG. 1.

The substrate temperature (Ts) during film formation is set as desired depending on the gas species employed and the kinds and required characteristics of the deposited film to be formed, but, in the case of obtaining an amorphous film, it is preferably from room temperature to 450° C., more preferably from 50° to 400° C. Particularly, in the case of forming a silicon film with better semiconductor and photoconductive characteristics, etc., the substrate temperature (Ts) should desirably be made 70° to 350° C. On the other hand, in the case of obtaining a polycrystalline film, it should preferably be 200° to 700° C. more preferably 300° to 600° C.

The atmospheric temperature (Tat) in the film forming space is determined in relation to the substrate temperature such that the precursors (E) and (D) are not changed to unsuitable chemical species for film formation, and also the precursors (E) may be efficiently generated.

FIG. 1 shows an example of preferable apparatus for practicing the method of the present invention.

The apparatus shown in FIG. 1 is broadly divided into a main body (vacuum chamber), an evacuation system, and a gas feeding system.

In the main body, a reaction space and a film forming space are provided.

101-108 are respective tanks filled with the gases to be used during film formation, 101a-108a are respective gas feeding pipes, 101b-108b are respective mass flow controllers for controlling the flow rates of the gases from the respective tanks, 101c-108c are respective gas pressure gauges, 101d-108d and 101e-108e are respective valves, and 101f-108f are respective pressure gauges indicating the pressures in the corresponding gas tanks.

120 is a vacuum chamber equipped at the upper portion with a means for gas introduction, a reaction space downstream of the gas introduction means, and also having a film forming space in which a substrate holder 112 is provided so that a substrate 118 may be placed opposed to the gas introducing port of said gas introduction means. The means for gas introduction has a triple concentric tubular structure, having from the innerside a first gas introducing pipe 109 for introducing gases from the gas tanks 101, 102, a second gas introducing pipe 110 for introducing gases from the gas tanks 103-105, and a third gas introducing pipe 111 for introducing gases from the gas tanks 106-108.

For gas introduction to the reaction space from each gas introducing pipe, each position is designed so as to be arranged farther from the substrate surface as the pipe is nearer to the inner side. In other words, the gas introducing pipes are arranged so that the pipe on the outer side may enclose the pipe located within the innerside thereof.

The gases from the respective tanks are fed into the respective introducing pipes through the gas feeding pipelines 123-125, respectively.

The respective gas introducing pipes, the respective gas feeding pipelines and the vacuum chamber 120 are evacuated through a main vacuum valve 119 by means of an evacuating device not shown.

The substrate 118 is set at a suitable desired distance from the positions of the respective gas introducing pipes by vertically moving the substrate holder 112.

In the case of the present invention, the distance between the substrate and the gas introducing port of the gas introducing means may be determined appropriately in view of the kinds and desired characteristics of the deposited film to be formed, the gas flow rates, the pressure inside the vacuum chamber, etc., but it is preferably several mm to 20 cm, more preferably 5 mm to about 15 cm.

113 is a heater provided in order to heat the substrate to an appropriate temperature during film formation, or preheating the substrate 118 before film formation, or further to anneal the film after film formation.

The substrate heater 113 is supplied with power through a conductive wire 114 from a power source 115.

116 is a thermocouple for measuring the temperature of the substrate (Ts) and is electrically connected to the temperature display device 117.

126 is an electrode for transmission of high frequency energy for generating plasma in the vacuum chamber 120 and is connected to a high frequency power source 127.

In the present invention, the method for forming a film doped with a valence electron controller is essentially different from that for formation of a semiconductor film not doped with a valence controller, but both types of film forming means can be arranged in a single apparatus. In this case, when either one of the film forming means is employed, the other deposited film forming means is not operated.

Also, it is possible to arrange both of the deposited film forming means adjacent to each other but separated by a gate valve, etc. and carry out film formation continuously.

The valence electron controller to be used in the present invention may include, in the case of silicon type semiconductor films or germanium type semiconductor films, a p-type valence electron controller, namely compounds containing elements of group III of the Periodic Table functioning as a so-called p type impurity such as B, Al, Ga, In, Tl, etc., and an n type valence electron controller, namely compounds containing elements of group V of the Periodic Table functioning as a so called n-type impurity such as N, P, As, Sb, Bi, etc.

Specifically, there may be included $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc.

The layer to be formed by the PCVD method is preferably formed by the use of an apparatus adapted for utilization of both the FOCVD method and the PCVD method as shown in FIG. 1. However, it may be formed by the use of a conventional PCVD apparatus.

Figure 5:
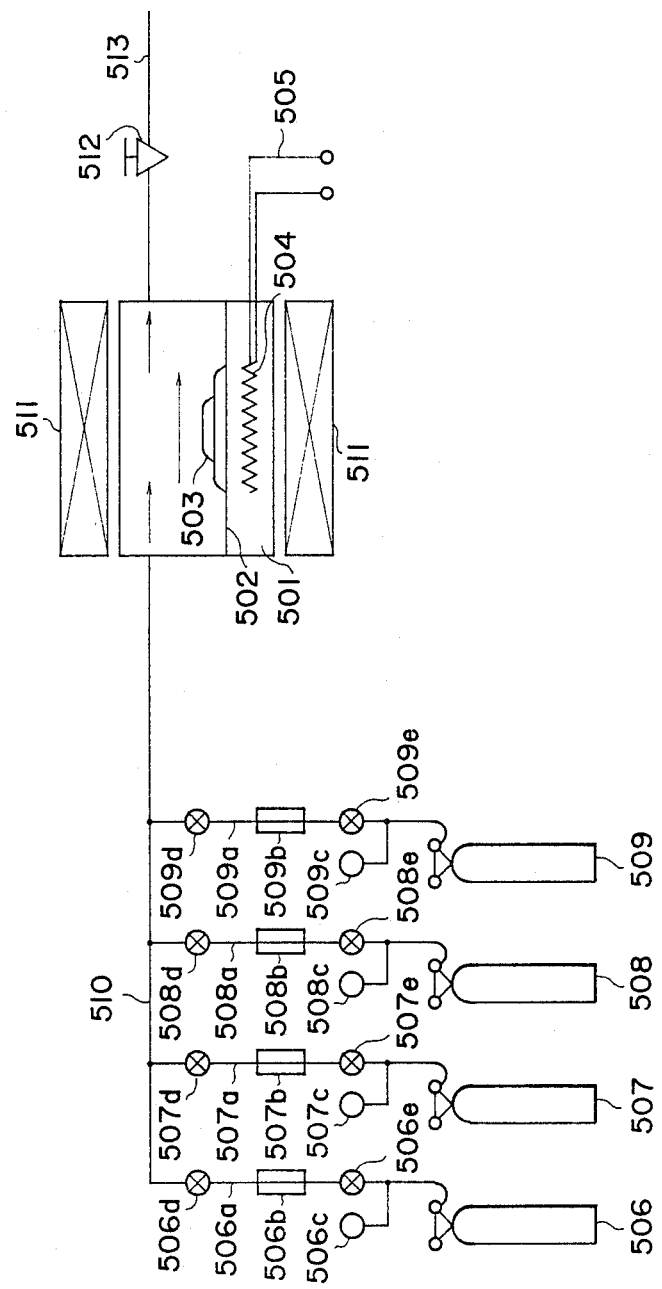
FIG. 5 is a schematic illustration of an apparatus for forming a film by the plasma CVD method.

FIG. 5 shows an example of the device for forming a deposited film according to the plasma CVD method, in which 501 is a film forming chamber having a film forming space, and a desired substrate 503 is placed on a substrate supporting stand 502 provided therein.

504 is a heater for heating the substrate and is supplied with power through a conductive wire 505 to generate heat.

506 through 509 are gas feeding sources provided corresponding to the kinds of gases required, including silicon containing compounds, hydrogen, halogen compounds, inert gases and compounds containing an impurity element acting as a valence electron controller. Of these starting material compounds, when those which are liquid under standard state are used, a suitable gasifying device is provided. In the drawing, the numerals of gas feeding sources 506 through 509 affixed with the symbol a are branch pipes, those affixed with b flowmeters, those affixed with c pressure gauges for measuring the pressures on the higher pressure side of the respective flowmeters, those affixed with d or e valves for controlling the respective gas flow rates. The gases of the starting material compounds are introduced through the introducing pipe 510 into the film forming chamber 501.

511 is a plasma generating device, and the plasma from the plasma generating device 511 acts on the starting material gas flowing in the direction of the arrowhead to excite and decompose the starting material gas to form a film doped with a valence electron controller on the substrate 503 through chemical reaction of the decomposed compound. 512 is an evacuation valve, and 513 is an evacuation pipe, which is connected to an evacuation device (not shown) for vacuum evacuation of the film forming space.

When, for example, a deposited film doped with a valence electron controller is formed by use of such an apparatus, a suitable substrate 503 is placed on the supporting stand 502 and the film forming chamber 501 is evacuated to reduced pressure through an evacuation pipe by use of an evacuation device (not shown).

Next, with heating of the substrate, if desired, starting material gases for film formation such as $SiH_4$, $N_2O$, $H_2$, etc., and starting material gases for valence electron control such as $B_2H_6$, $PH_3$, etc., are introduced from the gas feeding tanks through the gas introducing pipe 510 into the film forming chamber 501, and plasma is generated in the film forming chamber by the plasma generating device with the pressure in the film forming space being maintained at a predetermined pressure to form an A-Si:H:O:B film on the substrate 503.

The substrate to be used in the present invention may be either electroconductive or electrically insulating, provided that it is selected as desired depending on the use of the deposited film formed. As an electroconductive substrate, there may be mentioned metals such as NiCr, stainless steel, Al, Cr, Mo, Au, Ir, Nb, Ta, V, Ti, Pt, Pd, etc., or alloys thereof.

As an insulating substrate, there may be conventionally be used films or sheets of synthetic resins, including polyesters, polyethylene, polycarbonate, cellulose acetate, polypropylene, polyvinyl chloride, polyvinylidene chloride, polystyrene, polyamides, etc., glass, ceramics and so on. At least one side surface of these substrates is preferably subjected to a treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, $ITO(In_2O_3+SnO_2)$ thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by a laminating treatment with such metals, thereby imparting electroconductivity to the surface. The substrate may be shaped in any form such as cylinders, belts, plates or others, and its form may be determined as desired.

The substrate should preferably be selected from among those set forth above in view of adhesion and reactivity between the substrate and the film. Further, if the difference in thermal expansion between both is great, a large amount of strain may be created within the film which sometimes gives films of poor quality, and therefore it is preferable to use a substrate wherein the difference in thermal expansion is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

The present invention described in more detail by referring to the following Examples.

EXAMPLE 1

Figure 2:
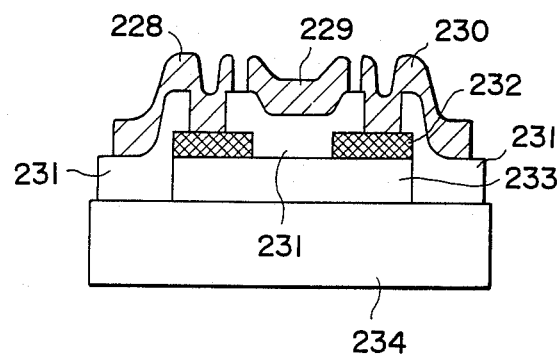
FIG. 2 is a schematic illustration of the layer constitution of a thin film transistor produced by the method of the present invention.

By use of the apparatus shown in FIG. 1, a thin film transistor shown in FIG. 2 (hereinafter referred to as "TFT") was prepared.

The above TFT is constituted of a glass substrate 234 (7059, produced by Corning Co.), an amorphous silicon layer (first layer, thickness 7000 Å) 233, an amorphous silicon layer doped with phosphorus to a high concentration (second layer, thickness 500 Å) 232, a silicon oxide layer (third layer, thickness 100 Å) 231, and Al electrodes 228, 229, 230.

In this example, in depositing the amorphous silicon layer 232 doped with phosphorus to a high concentration, $SiH_4$ gas in the tank 101 was introduced at a flow rate of 15 sccm through the gas introducing pipe 109, $PH_3$/He gas ($PH_3$ concentration 1000 ppm) in the tank 103 was introduced at a flow rate of 3 sccm through the gas introducing pipe 110 and He gas in the tank 107 was introduced at a flow rate of 30 sccm through the gas introducing pipe 111, and plasma of effective output of 30 W was excited by high frequency (13.56 MHz) generated from the electrode 126.

The amorphous silicon layer 233 and the silicon oxide layer 231 were deposited by mixing and reacting a gaseous starting material for formation of a deposited film and a gaseous halogenic oxidizing agent having the property of oxidizing said starting material in the vacuum chamber 120 (by FOCVD).

For the amorphous silicon layer 233, $SiH_4$ gas in the tank 101 was introduced at a flow rate of 20 sccm through the gas introducing pipe 109, $F_2$ gas in the tank 106 was introduced at a flow rate of 10 sccm, and He gas in the tank 107 was introduced at 100 sccm through the gas introducing pipe 111 into the vacuum chamber 120.

During this operation, the pressure in the vacuum chamber 120 was maintained at 0.7 Torr by controlling the opening of the vacuum valve 119. The distance between the gas introducing pipe 111 and the substrate was set at 3 cm. In the mixing region of $SiH_4$ gas and $F_2$ gas, blueish white luminescence was strongly observed.

For the silicon oxide layer 231, SiH, gas in the tank 101 was introduced at a flow rate of 15 sccm through the gas introducing pipe 109, $N_2O$ gas in the tank 106 was introduced at a flow rate of 5 sccm and He gas in the bomb 107 was introduced at a flow rate of 30 sccm through the gas introducing pipe into the vacuum chamber 120.

During this operation, the pressure in the vacuum chamber 120 was maintained at 0.3 Torr by controlling the opening of the vacuum valve 119.

During formation of all the layers, the substrate temperature was set at 250° C.

The TFT prepared by this Example exhibited an on-off ratio improved by about 12% as compared with the prior art product.

EXAMPLE 2

Figure 3:
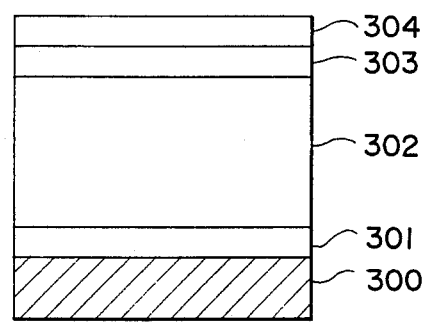
FIG. 3 is a schematic illustration of the layer constitution of a solar cell produced by the method of the present invention.

By use of the apparats shown in FIG. 1, a solar battery having the layer structure shown in FIG. 3 was produced. The above solar battery is constituted of Corning 7059 glass substrate 300 having a transparent electrode vapor deposited thereon, a p-type amorphous silicon layer (first layer, thickness 500 Å) 301, an i-type amorphous silicon layer (second layer, thickness 1 μm) 302, an n type amorphous silicon layer (third layer, thickness 500 Å) 303, and an Al electrode 304.

The first layer 301 was deposited by the same plasma CVD method as practiced in Example 1, and subsequently the second layer and the third layer were deposited by mixing and reacting the same gaseous starting material for formation of a deposited film and the gaseous halogenic oxidizing agent having the property of oxidizing said starting material as used in Example 1 in the vacuum chamber 120 (by FOCVD).

The film forming conditions according to this Example are shown in Table 1.

The solar battery thus obtained exhibited a conversion efficiency improved by 15% as compared with the prior art product.

EXAMPLE 3

Figure 4:
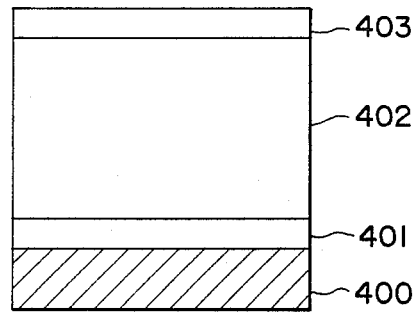
FIG. 4 is a schematic illustration of the layer constitution of an image forming member for electrophotography produced by the method of the present invention.

By use of the apparatus shown in FIG. 1, an image forming member for electrophotography having the layer constitution shown in FIG. 4 was prepared.

The above image forming member for electrophotography shown in FIG. 4 is constituted of an aluminum substrate 400; a charge injection preventing layer (first layer, amorphous silicon doped with B, 0.5 μm) 401, a photosensitive member (second layer, amorphous silicon, 18 μm) 402, and a surface protective layer (third layer, amorphous silicon carbide, 0.1 μm) 403.

According to the method shown in Example 1, an image forming member for electrophotography was produced under the film forming conditions shown in Table 2.

The image forming member for electrophotography obtained by this Example exhibited charging characteristics improved by 25% or more, and also was reduced in image defect number by about 10% as compared with the prior art product, the respective layers of which are continuously formed by the PCVD method.

TABLE 1

| Layer constitution | Starting material | Flow rate (sccm) | Deposition method | Pressure (Torr) |
|---|---|---|---|---|
| First layer (p-type) | $SiH_4$ | 20 | | 0.3 |
| | $B_2H_6$/He (1000 ppm) | 3 | PCVD | |
| | He | 20 | | |
| Second layer (i-type) | $SiH_4$ | 30 | | 0.8 |
| | $F_2$ | 30 | FOCVD | |
| | He | 200 | | |
| Third layer (n-type) | $SiH_4$ | 20 | | 0.5 |
| | $PH_3$/He (1000 ppm) | 2 | FOCVD | |
| | $F_2$ | 15 | | |
| | He | 100 | | |

(substrate temperature 250° C.)

TABLE 2

| Layer constitution | Starting material | Flow rate (sccm) | Deposition method | Pressure (Torr) |
|---|---|---|---|---|
| (substrate temperature 280° C.) | | | | |
| First layer (p-type) | SiH$_4$ | 25 | PCVD | 0.3 |
| | B$_2$H$_6$/He (1000 ppm) | 4 | | |
| | N$_2$O | 10 | | |
| | He | 25 | | |
| Second layer (i-type) | SiH$_4$ | 100 | FOCVD | 0.9 |
| | F$_2$ | 80 | | |
| | He | 250 | | |
| Third layer (A-SiC) | SiH$_4$ | 20 | PVCD | 0.4 |
| | CH$_4$ | 300 | | |
| | He | 10 | | |

We claim:

1. A method for producing in a film forming space an electronic device with a multi-layer structure having one or more valence electron controlled semiconductor thin layers formed on a substrate, which comprises:

(i) depositing via plasma chemical vapor deposition at least one of said valence electron controlled semiconductor thin layers and (ii) forming at least one other semiconductor thin layer by (a) separately introducing a gaseous starting material for formation of a deposited film and a gaseous halogenic oxidizing agent having the property of oxidizing said starting material into a reaction space through a gas introducing conduit system; (b) producing therefrom a mixture to effect chemical contact therebetween to thereby form a plural number of precursors containing at least one precursor in an excited state; (c) transferring said at least one precursor into the film forming space which is in communication with the reaction space so as to cause said at least one precursor to act as a feed source for the constituent element of and form said at least one other semiconductor thin layer; and (d) said gas introducing conduit system including a plurality of coaxially aligned conduits each having an exit orifice with an outer conduit adapted to carry said gaseous halogenic oxidizing agent and at least one inner conduit adapted to carry said gaseous starting material, said coaxially aligned conduits extending into the film forming space such that the exit orifices of the inner conduits are set inwardly from the exit orifice of the outer conduit to enable the gaseous halogenic oxidizing agent in the outer conduit to surround the gaseous starting material exiting said inner conduit, said substrate positioned from several millimeters to 20 centimeters from the exit orifice of said outer conduit.

2. A method for producing an electronic device according to claim 1, wherein said gaseous starting material is a chain type silane compound.

3. A method for producing an electronic device according to claim 2, wherein said chain type silane compound is a straight chain silane compound.

4. A method for producing an electronic device according to claim 3, wherein said straight chain silane compound is represented by the formula Si$_n$H$_{2n+2}$ where n is an integer of 1 to 8.

5. A method for producing an electronic device according to claim 2, wherein said chain type silane compound is a branched chain silane compound.

6. A method for producing an electronic device according to claim 1, wherein said gaseous starting material is a silane compound having a cyclic structure of silicon.

7. A method for producing an electronic device according to claim 1, wherein said gaseous starting material is a chain type germane compound.

8. A method for producing an electronic device according to claim 7, wherein said chain type germanium compound is represented by the formula Ge$_m$H$_{2m+2}$ where m is an integer of 1 to 5.

9. A method for producing an electronic device according to claim 1, wherein said gaseous starting material is a hydrogenated tin compound.

10. A method for producing an electronic device according to claim 1, wherein said gaseous starting material is a tetrahedral type compound.

11. A method for producing an electronic device according to claim 1, wherein said gaseous halogenic oxidizing agent contains a halogen gas.

12. A method for producing an electronic device according to claim 1, wherein said gaseous halogenic oxidizing agent contains fluorine gas.

13. A method for producing an electronic device according to claim 1, wherein said gaseous halogenic oxidizing agent contains chlorine gas.

14. A method for producing an electronic device according to claim 1, wherein said gaseous halogenic oxidizing agent is a gas containing fluorine atoms as as constituent.

15. A method for producing an electronic device according to claim 1, wherein said gaseous halogenic oxidizing agent contains a nascent halogen.

16. A method for producing an electronic device according to claim 1, wherein said substrate is arranged at a position opposed to the direction in which said gaseous starting material and said gaseous halogenic oxidizing agent are introduced into said reaction space.

* * * * *